US006614666B1

United States Patent
Chen et al.

(10) Patent No.: US 6,614,666 B1
(45) Date of Patent: Sep. 2, 2003

(54) UNIVERSAL OUTPUT DRIVER

(75) Inventors: June-Ying Chen, Milpitas, CA (US); Menping Chang, Cupertino, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/142,695

(22) Filed: May 8, 2002

(51) Int. Cl.[7] ............................................. H02M 3/335
(52) U.S. Cl. ....................................................... 363/20
(58) Field of Search ................................ 363/15, 16, 20, 363/95, 97, 131; 323/247, 255, 328, 340

(56) References Cited

U.S. PATENT DOCUMENTS

| | | | | |
|---|---|---|---|---|
| 4,280,174 A | * | 7/1981 | Sonda | 363/24 |
| 5,414,309 A | * | 5/1995 | Ichikawa et al. | 327/110 |
| 5,488,554 A | * | 1/1996 | Green | 363/25 |
| 5,895,983 A | * | 4/1999 | Motomura | 307/106 |
| 6,114,844 A | * | 9/2000 | Chang et al. | 323/281 |
| 6,316,927 B1 | * | 11/2001 | Chang et al. | 323/312 |

* cited by examiner

*Primary Examiner*—Matthew Nguyen
(74) *Attorney, Agent, or Firm*—Fenwick & West LLP

(57) ABSTRACT

A circuit for driving a communication line includes a transformer having a secondary winding for supplying an output drive signal, and having a primary winding connected to conduct current through a control element that receives a control signal which stabilizes the amplitude of output drive signal, independent of variations in supply voltage. A control circuit produces the control signal in response to the difference of signals produced across conductive elements that are connected to separate current sources which supply currents determined by arithmetic relationships between the values of different supply voltages.

7 Claims, 3 Drawing Sheets

UNIVERSAL OUTPUT DRIVER

RELATED CASES

The subject matter of this application relates to the subject matter of U.S. Pat. Nos. 6,316,927 and 6,114,844 which are incorporated herein by reference in their entireties.

FIELD OF THE INVENTION

This invention relates to line communications and more particularly to a line driver capable of producing output drive signals with amplitudes greater than the supply voltage.

BACKGROUND OF THE INVENTION

Conventional line drivers commonly produce output signals with amplitudes that are limited by supply voltages. As integrated circuitry and process technologies improved, supply voltages reduced with associated reductions in the amplitudes of output drive signals.

Certain known schemes for increasing the amplitudes of output drive signals employ current-drive circuitry and transformer windings to produce output signals of greater amplitude than the supply voltages. However, such current-drive circuits commonly consume more power than voltage-drive circuitry and the inductive impedance inhibits rapid turn on/turn off operation.

SUMMARY OF THE INVENTION

In accordance with an illustrated embodiment of the present invention, a center-tapped transformer and associated drive circuitry deliver output drive signals with greater amplitude than the supply voltages, and with the associated drive circuitry greatly simplified to reduce power consumption and the processing involved for integrating the drive circuitry. P-MOS circuitry connected to a high-side supply voltage is eliminated in favor of transformer coupling from an N-MOS low-side supply voltage. The transformer also isolates the output drive signal from ground for enhanced versatility in connecting to communication lines. Output wave shapes for universal driver applications may be controlled in response to activation of a plurality of variable conduction elements in accordance with a selected logical sequence.

DETAILED DESCRIPTION OF THE INVENTION

Figure 1:
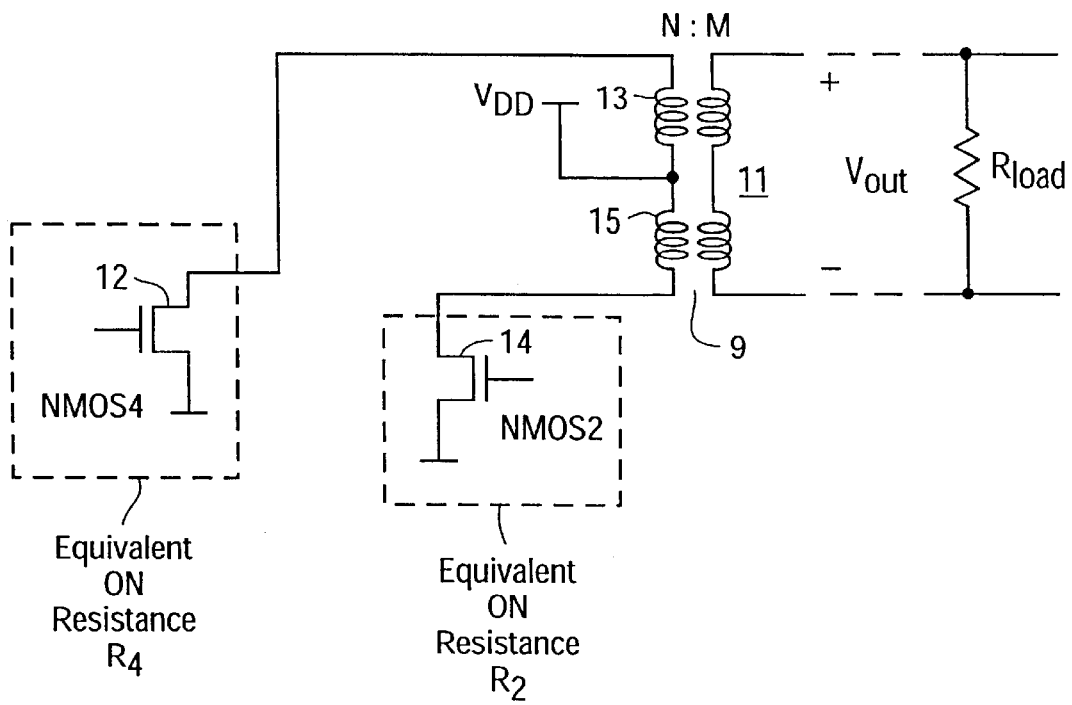
FIG. 1 is a schematic diagram of a line-driver circuit including a transformer of selected turns ratio and single ended N-MOS driver circuits.

Referring now to FIG. 1, there is shown a schematic diagram of a circuit including a transformer 9 of selected n:m turns ratio, and forming a basis for describing operation of the present invention. Each single-ended input including N-MOS transistors 12,14 controls application of supply voltage $V_{DD}$ to respective portions of the center-tapped primary winding 13,15. Specifically, it can be shown that the maximum output voltage Vout across the secondary winding 11 of the transformer 9 is determined.

$$V_{out} = V_{DD} \times \frac{m}{n} \times \frac{\left(\frac{1}{2}\frac{n}{m}\right)^2 R_L}{R_2 + \left(\frac{1}{2}\frac{n}{m}\right)^2 R_L} \times 2 \quad \text{(Equation 1)}$$

Thus, $$V_{out} = 2\frac{m}{n} V_{DD} \left(\frac{R_L}{\left(2\frac{m}{n}\right)^2 R_2 + R_L}\right) \quad \text{(Equation 2)}$$

and $$V_{out} = 2\frac{m}{n} V_{DD}, \text{ as } R_2 \rightarrow 0 \quad \text{(Equation 3)}$$

Vout can be therefore greater than $V_{DD}$, if m>½n.

$R_2$, as the equivalent resistance of the N-MOS transistor 14 in the ON conduction state, is substantially equal to the equivalent resistance R4 of the N-MOS transistor 12 in the ON conductive state. In addition, although the circuit may be driven or controlled single-endedly via transistor 12 or 14, the output $V_{out}$ is differential due to the windings on the transformer 9.

From Equation 3, it should be noted that the value of resistance $R_2$ (or its equivalent, $R_4$) must be carefully controlled in order to produce output signal of stable amplitude that is independent of the supply voltage $V_{DD}$, and independent of process variations by which the N-MOS transistor 12 (and 14) is produced. Thus, from Equation 1, the stable value of output voltage may be set at $V_{BG}$ (i.e., the conventional bandgap voltage):

$$V_{out} = V_{DD}\left(\frac{2R_{LOAD}}{R_{LOAD} + 4R_2}\right) = V_{CONSTANT} = aV_{BG} \quad \text{(Equation 4)}$$

where m=n and α is an arbitrary ratio.
this is represented by a stable, internal voltage supply. Thus:

$$\frac{V_{DD}}{aV_{BG}} = \frac{1}{2} + \frac{2R_2}{R_{LOAD}} \quad \text{(Equation 5)}$$

and $$R_2 = \left(\frac{V_{DD} - \frac{aV_{BG}}{2}}{V_{BG}}\right)\frac{R_{load}}{2} \quad \text{(Equation 6)}$$

and $$R_2 \alpha \left(\frac{V_{DD} - \frac{aV_{BG}}{2}}{I_{EXT}}\right) \quad \text{(Equation 7)}$$

where:

$$I_{EXT} = \frac{V_{BG}}{R_{EXT}}$$ (Equation 8)

and $R_{EXT}$ is an external resistor that behaves similarly to $R_{LOAD}$. Thus:

$$R_2 \alpha \frac{V_{DD} - V_{BG}}{I_{EXT}}$$ (Equation 9)

for α chosen to be 2.
and the temperature effects of the external resistor and the load resistor substantially cancel.

Figure 2:
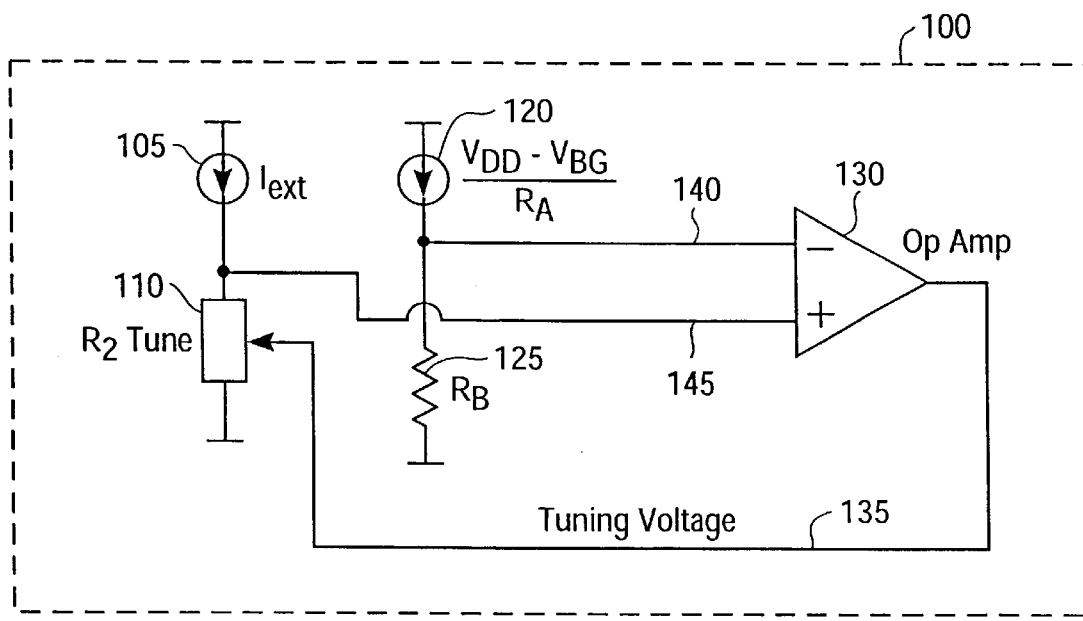
FIG. 2 is a schematic diagram of one embodiment of a circuit for implementing the defining equation.

Referring now to FIG. 2, there is shown a schematic diagram of one circuit embodiment for implementing the control of the equivalent resistance $R_2$. Specifically, current source, $I_{ext}$, 105 is connected to a variable equivalent resistance $R_2$ 110, and current source 120 of value $$\frac{V_{DD} - V_{BG}}{R_A}$$

is connected to resistance $R_B$ 125 in a bridge-type circuit configuration. The operational amplifier 130 has a pair of inputs 140, 145 that are connected to the common junctions of the respective current sources and equivalent resistances, as shown, to supply an output 135 to adjust the value of $R_2$ 110 in response to the difference of voltages on the common junctions.

Figure 3:
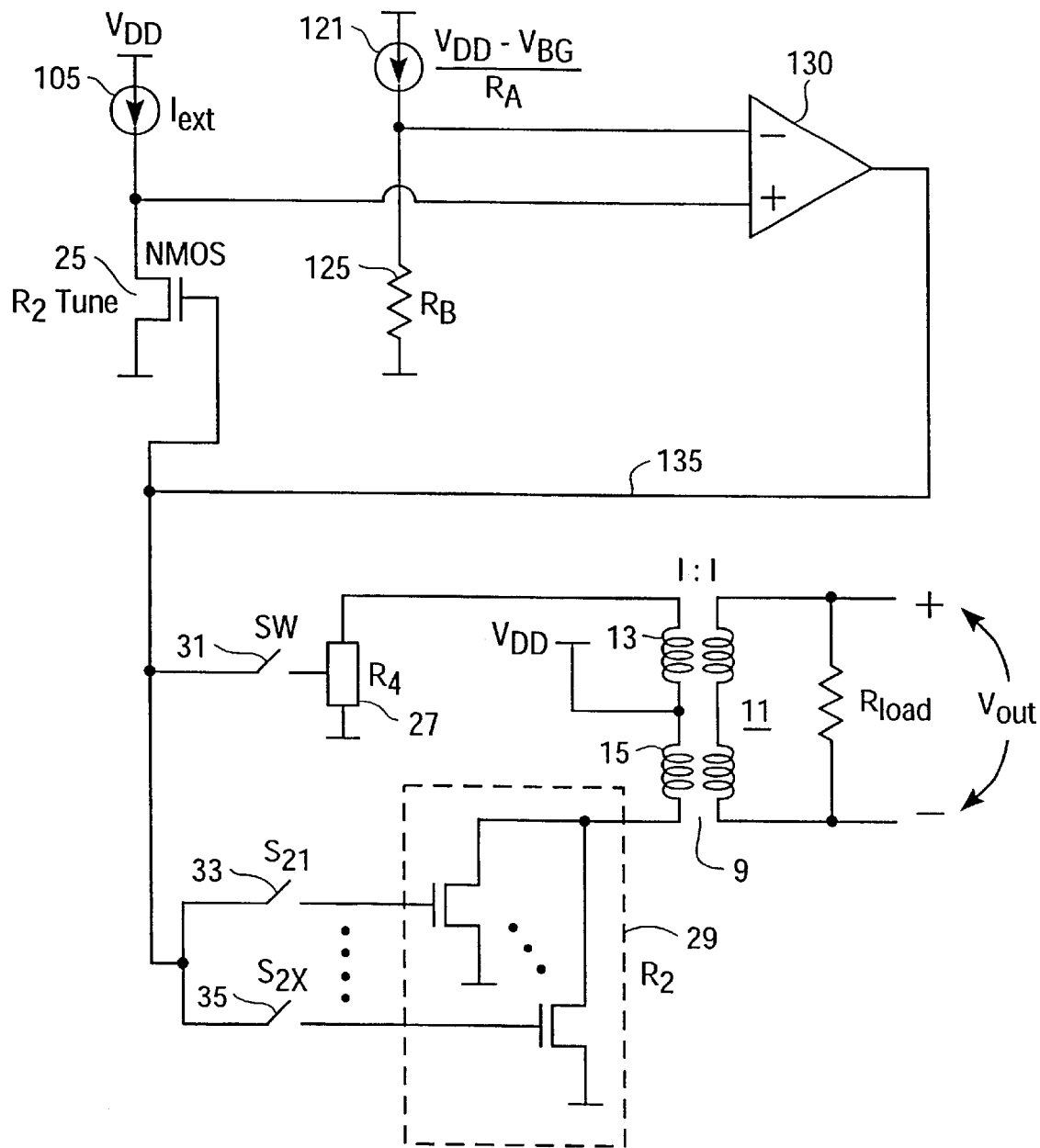
FIG. 3 is a schematic diagram of an embodiment of the driver circuits including the circuit of FIG. 2 and circuitry for energizing the primary windings of the transformer.

Referring, then, to FIG. 3, there is shown the schematic diagram of one embodiment of the driver circuit of the present invention including the driver circuit and resistance-controlling circuit of FIGS. 1 and 2. Specifically, the adjustable resistance in the circuit of FIG. 2 is shown as an N-MOS transistor 25, and the inputs to the primary windings 13, 15 of the transformer 9 are also shown as N-MOS transistors or equivalent resistors 27, 29, with switch arrays 31, 33, 35 shown connecting the gates thereof to receive the controlling output signal 135 from the amplifier 130. Such switches may be conventionally implemented as logic gates that are turned ON/OFF controllably. The ON/OFF status of switch 31 may serve as an input to the circuit, and the plurality of switches 33, 35 may be turned ON/OFF in a selected sequence to set rise and fall times or other wave forming functions of the output signal. The selected transformer ratio is conveniently set at 1:1, for example, to facilitate bifilar winding for size reduction and coupling efficiency between windings.

Figure 4A:
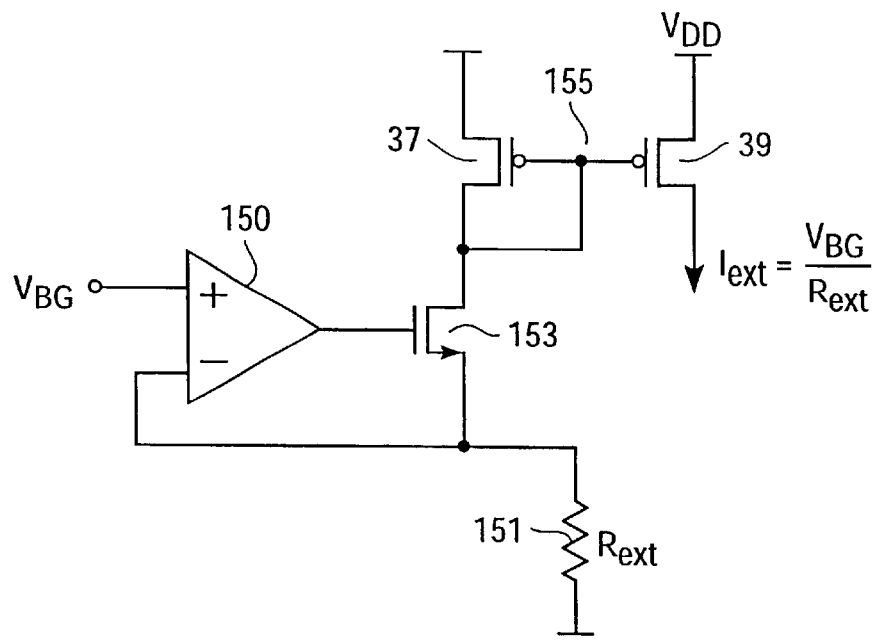
FIGS. 4a, b are schematic diagrams of circuitry for producing the requisite current supplies in the circuit of FIG. 3.

Referring now to FIG. 4a, there is shown a schematic diagram of one circuit embodiment for implementing the current source $I_{EXT}$ 105 in the circuit of FIG. 3. Specifically, operational amplifier 150 is referenced to the voltage supply $V_{BG}$ and receives the voltage drop across an external resistor $R_{EXT}$ 151 to apply the amplified difference between the two voltages to the gate of N-MOS transistor 153. This transistor 153 is serially connected with one branch of current mirror 155 formed by P-MOS transistors 37, 39 that is connected between $V_{DD}$ and $R_{EXT}$ 151. The other branch of current mirror 155 supplies the current $$I_{EXT} = \frac{V_{BG}}{R_{EXT}}$$

from the $V_{DD}$ voltage supply in the circuit of FIG. 3.

Figure 4B:
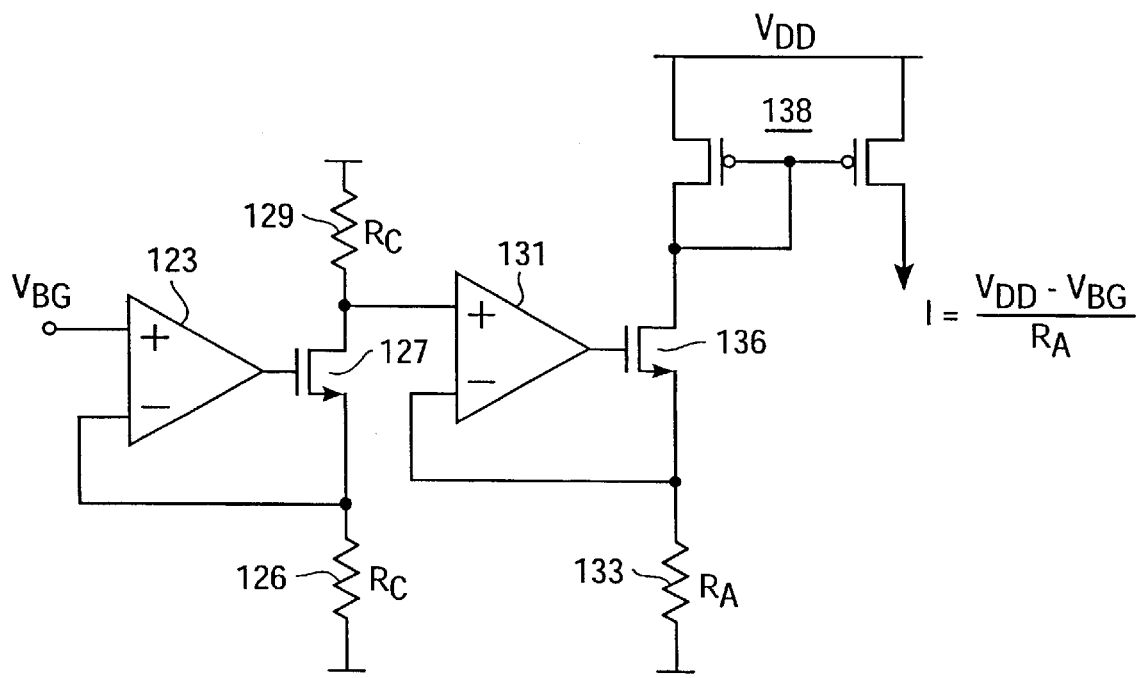

Referring now to FIG. 4b, there is shown a schematic diagram of one circuit embodiment for implementing the current source 121 of value I=

$$I = \frac{V_{DD} - V_{BG}}{R_A}$$

in the circuit of FIG. 3. Specifically, operational amplifier 123 is referenced to the voltage $V_{BG}$, and is connected to receive the voltage across resistor $R_C$ 126 as one of the resistors in the circuit comprising the resistor $R_C$ 126 and N-MOS transistor 127 and resistor $R_C$ 129 connected between $V_{DD}$ and ground. Operational amplifier 131 is connected to receive the voltage appearing across the combination of resistor Rc 126 and the N-MOS transistor 127, and is also connected to receive the voltage appearing across resistor $R_A$ 133 connected to ground. The amplified difference of these two voltages is supplied to the gate of N-MOS transistor 136 which conducts current through one branch of the 'current mirror' circuit 138 that thus supplies the current $$I = \frac{V_{DD} - V_{BG}}{R_A}$$

for the circuit of FIG. 3 through the other branch of the current mirror 138. All of the transistors and operational amplifiers and resistors may be conveniently fabricated on a common semiconductor substrate using conventional integrated circuit processing.

Therefore, the line driver of the present invention is capable of operating at low supply voltage to produce output drive signals with amplitudes greater than the supply voltage, and with stabilized signal amplitude that is substantially independent of variations in amplitude of the supply voltage, and with universally-compatible wave shaping under logic control.

What claimed is:

1. A driver circuit comprising:

a transformer including a center-tapped primary winding having end terminals and including a secondary winding in a selected turns ratio, with the secondary winding providing a circuit output;

a first voltage supply connected to the center tap of the primary winding and a control element connected to an end terminal of the primary winding for controlling conduction of current therethrough from the first voltage supply; and a control circuit connected to supply control signal to the control element for controlling the conductivity thereof during conduction of current through the primary winding;

said control circuit including a current source serially connected at a first junction with an adjustable conduction element, and a second current source serially connected at a second junction with a resistive element, and including an amplifier connected to the first and second junctions for supplying a control signal to the conduction element to adjust the conduction thereof in response to signals appearing at the first and second junctions.

2. The driver circuit according to claim 1, in which the first current source supplies current in proportion to the ratio of a second voltage supply to a first selected resistance value, and the second current source supplies current in proportion to the ratio of the difference between first and second voltage supplies to a second selected resistance value.

3. The driver circuit according to claim 1 in which the end terminals of the primary winding of the transformer are each connected to a control element that communicates with the control circuit to receive the control signal therefrom for controlling the conduction of current therethrough.

4. A driver circuit comprising:
- a transformer having a center-tapped primary winding with end terminals and a secondary winding forming the circuit output;
- a first source of voltage connected to the center top of the primary winding;
- first and second control means connected to the end terminals of the primary winding for controlling conduction of current therethrough in response to applied control signal;
- circuit means including first and second current sources connected to respective first and second resistor means, and including an amplifier connected to receive the signals from the first and second resistor means for producing therefrom the control signal supplied to the first and second control means and to the first resistor means for controlling the conductivity thereof.

5. The driver circuit according to claim 4 in which the first current source supplies a current proportional to a ratio of a voltage from a second source to first a selected resistance value; and in which the second current source supplies a current proportional to a ratio of the difference of voltages from the first and second sources to a second resistance value; and said control signal is selectively supplied to at least one of the first and second control means in response to an applied input signal.

6. The driver circuit according to claim 5 in which the second control means includes a plurality of variable conduction elements, and the control signal is selectively supplied to at least one of the variable conduction elements to control a parameter of signal produced at the circuit output.

7. The driver circuit according to claim 6 in which the plurality of variable conduction elements are activated in a selected sequence to alter the wave shape of signal produced at the circuit output.

\* \* \* \* \*